(12) United States Patent
Wei et al.

(10) Patent No.: US 9,318,976 B1
(45) Date of Patent: Apr. 19, 2016

(54) ADJUSTABLE PWM METHOD TO INCREASE LOW SPEED STARTING TORQUE AND INVERTER VOLTAGE MEASUREMENT ACCURACY

(71) Applicant: Rockwell Automation Technologies, Inc., Mayfield Heights, OH (US)

(72) Inventors: Lixiang Wei, Mequon, WI (US); Jeffrey D. McGuire, Franklin, WI (US); Timothy M. Rowan, Wauwatosa, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 22 days.

(21) Appl. No.: 14/527,804

(22) Filed: Oct. 30, 2014

(51) Int. Cl.
  *H02M 1/14* (2006.01)
  *H02M 7/537* (2006.01)
(52) U.S. Cl.
  CPC .................................. *H02M 7/537* (2013.01)
(58) Field of Classification Search
  CPC ........ H02P 27/08; H02P 27/06; H02M 7/537; H02M 7/527; H02M 7/5375
  USPC ......... 363/34, 35, 37, 39, 40, 41, 97, 98, 131, 363/132
  See application file for complete search history.

(56) References Cited

U.S. PATENT DOCUMENTS

| | | |
|---|---|---|
| 5,623,219 A | 4/1997 | Karraker |
| 5,936,856 A | 8/1999 | Xiang |
| 6,023,417 A | 2/2000 | Hava et al. |
| 6,185,115 B1 | 2/2001 | Sul et al. |
| 6,233,396 B1 | 5/2001 | Kuwada et al. |
| 6,617,819 B2 | 9/2003 | Dohmae et al. |
| 6,710,564 B2 | 3/2004 | Shibuya et al. |
| 7,034,501 B1 | 4/2006 | Thunes et al. |
| 7,102,327 B2 | 9/2006 | Ho |
| 7,141,943 B2 | 11/2006 | Song et al. |
| 7,187,155 B2 | 3/2007 | Matsuo et al. |
| 7,190,599 B2 | 3/2007 | Virolainen et al. |
| 7,265,954 B2 | 9/2007 | Hikawa et al. |
| 7,400,518 B2 | 7/2008 | Yin et al. |
| 7,495,938 B2 | 2/2009 | Wu et al. |
| 7,629,764 B2 | 12/2009 | Shoemaker et al. |
| 7,649,756 B2 | 1/2010 | Kerkman et al. |
| 7,679,310 B2 | 3/2010 | Schulz et al. |
| 7,738,267 B1 | 6/2010 | Tallam et al. |
| 7,759,897 B2 | 7/2010 | Piippo |
| 7,825,621 B2 | 11/2010 | Wei et al. |

(Continued)

OTHER PUBLICATIONS

Hava, et al., "A High Performance Generalized Discontinuous PWM Algorithm", IEEE Applied Power Electronics Conference, Feb. 1997, vol. 2, pp. 886-891, IEEE Trans. on Industry Applications Version.

(Continued)

*Primary Examiner* — Adolf Berhane
*Assistant Examiner* — Alex Torres-Rivera
(74) *Attorney, Agent, or Firm* — Fay Sharpe LLP

(57) ABSTRACT

Methods, control apparatus and computer readable mediums are presented for controlling a switching inverter in which a controller selectively suspends PWM carrier signals to provide inverter switching control signals using zero vectors in response to a maximal pulse width value for a present PWM half cycle being greater than a threshold value, and accumulates a present output control value for individual output phases for use in a subsequent PWM half cycle for selective effective reduction in switching frequency for low-speed operation while maintaining high frequency control loop sampling.

20 Claims, 5 Drawing Sheets

(56) References Cited

U.S. PATENT DOCUMENTS

| | | |
|---|---|---|
| 7,881,081 B1 | 2/2011 | Tallam et al. |
| 8,054,032 B2 | 11/2011 | Chakrabarti et al. |
| 8,107,267 B2 | 1/2012 | Tallam et al. |
| 2004/0195995 A1 | 10/2004 | Quirion et al. |
| 2006/0067092 A1 | 3/2006 | Nondahl et al. |
| 2007/0268728 A1 | 11/2007 | Mohan et al. |
| 2010/0165674 A1 | 7/2010 | Dai et al. |
| 2010/0172161 A1 | 7/2010 | Tallam et al. |
| 2011/0012544 A1* | 1/2011 | Schulz .................. B60L 15/025 318/400.02 |
| 2011/0299308 A1 | 12/2011 | Cheng et al. |
| 2012/0075892 A1 | 3/2012 | Tallam et al. |
| 2012/0112674 A1 | 5/2012 | Schulz et al. |
| 2012/0140532 A1 | 6/2012 | Tallam et al. |
| 2012/0201056 A1 | 8/2012 | Wei et al. |
| 2014/0297131 A1* | 10/2014 | Kashima .................. H02P 6/002 701/42 |
| 2015/0077025 A1* | 3/2015 | Suzuki .................. B62D 5/0463 318/400.02 |
| 2015/0180382 A1* | 6/2015 | Hamada .................. H02P 6/002 318/722 |

OTHER PUBLICATIONS

Sutar et al., "Performance Analysis of Z-Source Inverter Fed Induction Motor Drive", Int'l Journal of Scientific & Engineering Research, vol. 3, Issue 5, May 2012, pp. 1-6.

Yoo et al., "Third Harmonic Injection Circuit to Eliminate Electrolytic Capacitors in Light-Emitting Diode Drivers", Journal of Electrical Engineering & Technology, vol. 7, No. 3, pp. 358-365, 2012.

Younis et al., "High Efficiency THIPWM Three-Phase Inverter for Grid Connected System", 2010 IEEE Symposium on Industrial Electronics and Applications (ISIEA 2010), Oct. 3-5, 2010, Penang, Malaysia, pp. 88-93.

Younis et al., "Simulation of Grid Connected THIPWM-Three-Phase Inverter Using SIMULINK", 2011 IEEE Symposium on Industrial Electronics and Applications (ISIEA2011), Sep. 25-28, 2011, Langkawi, Malaysia, pp. 133-137.

Jiang et al., "Variable Switching Frequency PWM for Three-Phase Converter for Loss and EMI Improvement", Conference Record of APEC, Oct. 2012, pp. 1576-1583.

\* cited by examiner

ADJUSTABLE PWM METHOD TO INCREASE LOW SPEED STARTING TORQUE AND INVERTER VOLTAGE MEASUREMENT ACCURACY

BACKGROUND INFORMATION

The subject matter disclosed herein relates to power conversion, and more specifically to adjustable pulse width modulation apparatus and techniques for operating power converters.

BRIEF DESCRIPTION

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present various concepts of the disclosure in a simplified form prior to the more detailed description that is presented hereinafter. The present disclosure provides methods as well as control apparatus and computer readable mediums for controlling a switching inverter by selectively using zero vectors in response to a maximal pulse width value for a present PWM half cycle being greater than a threshold value, and accumulation of a present output control value for individual output phases for use in a subsequent PWM half cycle.

BRIEF DESCRIPTION OF THE DRAWINGS

The following description and drawings set forth certain illustrative implementations of the disclosure in detail, which are indicative of one or more exemplary ways in which the various principles of the disclosure may be carried out. The illustrated examples are not exhaustive of the many possible embodiments of the disclosure. Various objects, advantages and novel features of the disclosure will be set forth in the following detailed description when considered in conjunction with the drawings, in which:

FIGS. 2-8 are waveform diagram.

DETAILED DESCRIPTION

Referring now to the figures, one or more embodiments or implementations are hereinafter described in conjunction with the drawings, wherein the various features are not necessarily drawn to scale.

Figure 1:
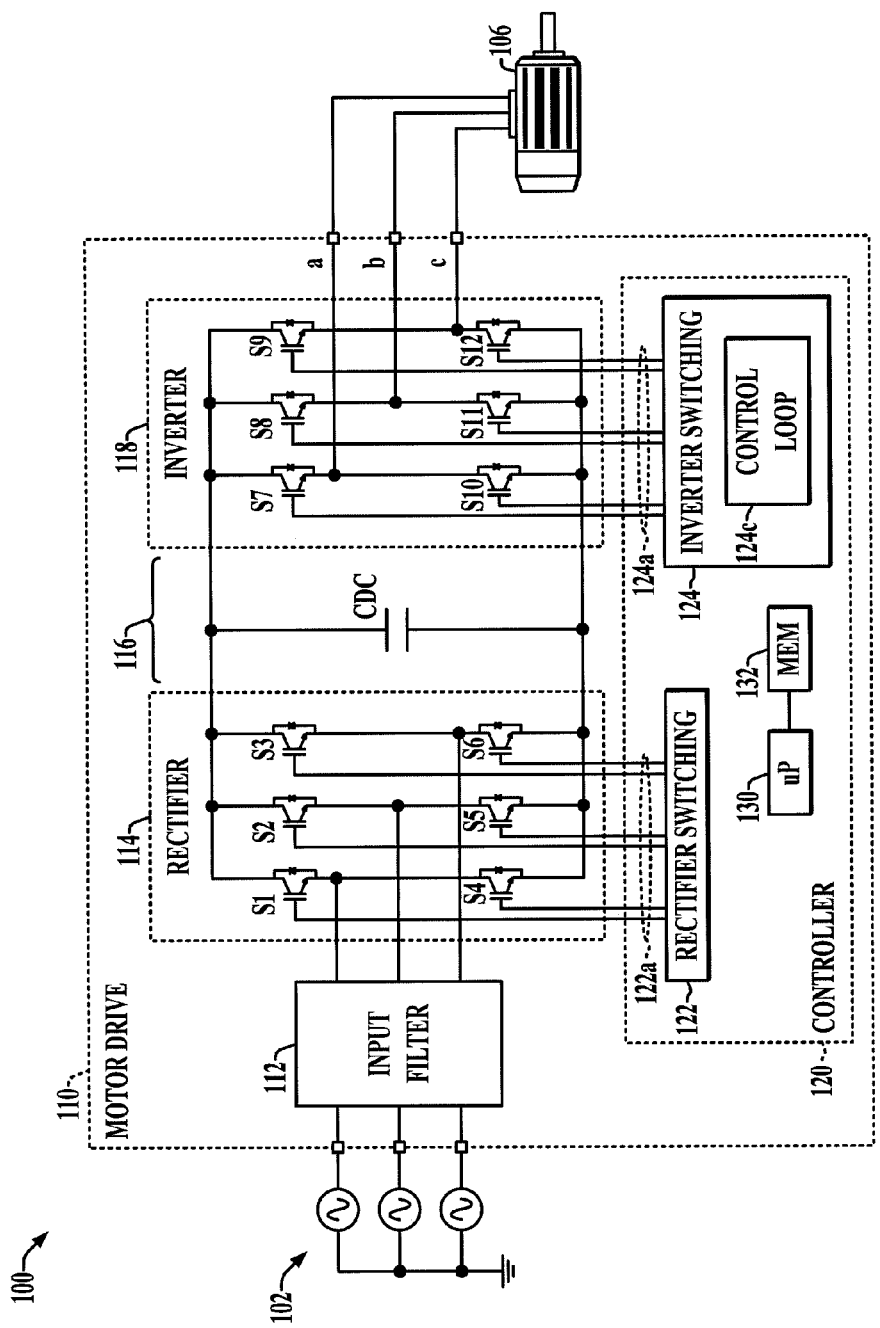
FIG. 1 is a schematic system diagram.

FIG. 1 shows a power conversion system 100, in this case a motor drive power converter 110, with an output switching inverter 118 providing a multiphase variable frequency AC output to drive a motor load 106. The various concepts of the present disclosure are illustrated and described in the context of a motor drive type power conversion system 110, although the present disclosure is not limited to motor drives and can be implemented in various forms of power conversion systems having a single or multiphase switching inverter, including without limitation motor drives, grid-tie converters, wind energy systems, etc. The drive 110 receives multiphase AC input power from an external source 102 and converts the received power via a rectifier 114 to provide a DC bus voltage in an intermediate circuit 116, although other embodiments are possible in which single phase input power is provided to the system 110. In addition, the illustrated system 110 receives a three-phase input, but other multiphase embodiments are possible. Moreover, different embodiments may receive DC input power, for example, without requiring an internal rectifier 114. The system 110 also includes an input filter circuit 112, in one embodiment a three phase LCL filter having grid side inductors as well as series connected converter side inductors in each line, with filter capacitors (not shown) connected between the corresponding grid and converter side inductors and a common connection node or neutral, which may but need not be connected to a system ground. Other alternate input filter circuit configurations can be used, including without limitation LC filters. The disclosed techniques are further applicable for motor side inverters with non-regenerative rectifier topologies and other applications.

The motor drive 110 in FIG. 1 also includes a rectifier 114, a DC bus or DC link circuit 116 and a multiphase switching inverter 118 providing an AC output to drive the load 106. The rectifier 114 and the inverter 118 in one embodiment include switches S1-S6 and S7-S12, respectively, which can be IGBTs, FETs, or other suitable form of electrical switches operated by a controller 120 using suitable switching control signals 122*a* and 124*a* from a controller 120. The controller 120 includes a rectifier controller 122 for selectively providing rectifier switching control signals 122*a* to operate the switches S1-S6 to rectify the three phase input power to provide a DC bus voltage across a DC link capacitor CDC in the DC link circuit 116. The system 110 in this example is a voltage source converter (VSC). Other embodiments are possible in which the link circuit 116 includes one or more link chokes or inductors, with the rectifier converter 114 providing a controlled DC link current for a current source converter (CSC) drive system 110. The illustrated system 110 includes an active rectifier or active front end (AFE) 114, although a passive rectifier circuit can alternatively be used in other embodiments or the drive 110 may directly receive a DC input for use by the inverter 118. Moreover, the illustrated input filter 112 may be omitted in certain implementations, and an output transformer and trap filter circuit (not shown) can be provided in certain embodiments, which may be external to the drive system 110 or may be integral thereto in various embodiments to boost the output voltage provided by the drive system 118 for driving a high voltage motor load 106, with a trap filter being a multiphase LCL or LC configuration to reduce the output transformer voltage ripple and protect the motor load 106.

The inverter switches S7-S12 operate according to switching control signals 124*a* from an inverter switching component 124 of the drive controller 120 to provide a multiphase output to drive the load 106 according to one or more desired output operating parameters, such as output speed or frequency, torque, etc. The inverter controller 124 in one embodiment computes a command modulation index and an angle used in generating pulse width modulation (PWM) switching control signals 124*a* or the controller 124 can implement sine triangle pulse width modulation to achieve the desired motor speed, torque, etc. in each of a series of inverter PWM switching cycles. The drive controller 120 and the components thereof may be implemented as any suitable hardware, processor-executed software, processor-executed firmware, logic, and/or combinations thereof wherein the illustrated controller 120 can be implemented using processor-executed software or firmware providing various control functions by which the controller 120 receives feedback and/or input signals and/or values (e.g., setpoint(s)) and provides rectifier and inverter switching control signals 122*a* and 124*a* to operate the rectifier switching devices S1-S6 and switches S7-S12 of the inverter 118 to convert input power for providing AC output power to drive the load 106. In addition, the controller 120 and the components thereof can be implemented in a single processor-based device, such as a microprocessor, microcontroller, FPGA, etc., or one or more of these can be separately implemented in unitary or distributed fashion by two or more processors.

The rectifier and inverter switches S1-S12 are operable according to corresponding switching control signals 122a, 124a to selectively conduct current when actuated. In this regard, the rectifier and inverter switching control components 122 and 124 of the drive controller 120 may include analog driver circuitry to generate signals suitable for operating the switching devices S1-S12. In addition, diodes are connected across the individual IGBTs S1-S12 in the embodiment of FIG. 1 although not a requirement of all possible embodiments. Operation of the rectifier switches S1-S6 is controlled according to pulse width modulated rectifier switching control signals 122a to provide active rectification of the AC input power from the source 102 to provide a DC voltage across the capacitance CDC (or to provide DC current through a link choke for a current source converter (CSC) implementation). Passive rectifiers may be used in other possible embodiments.

The inverter switches S7-S12 are coupled to receive power from the DC bus 116 and to provide AC output power to the motor or other load 106, where the switches S7-S12 operate according to the PWM switching control signals 124a from the inverter controller 124. The inverter controller 124 in certain embodiments may also provide a DC command signal or value to the rectifier controller 122 to cause the rectifier controller 122 to operate the rectifier switches S1-S6 to provide a regulated DC output accordingly. As seen in FIG. 1, moreover, the inverter controller 124 implements a control loop 124c which receives various input signals or values, including setpoint signals or values for desired output operation, such as motor speed, position, torque, etc., as well as feedback signals or values (not shown) representing operational values of various portions of the motor drive system 110.

Figure 2:
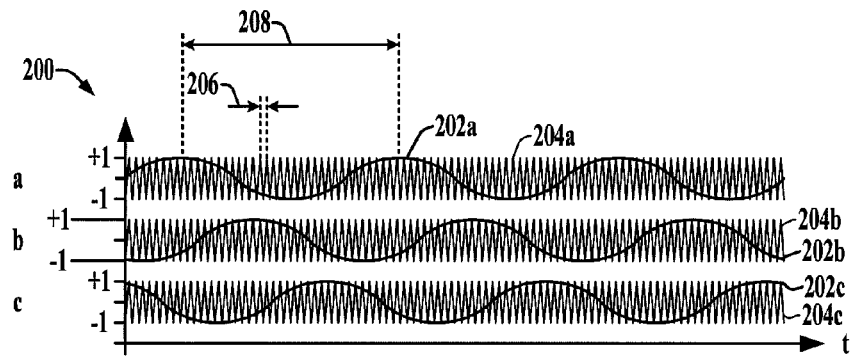
FIG. 2 is
Figure 3:
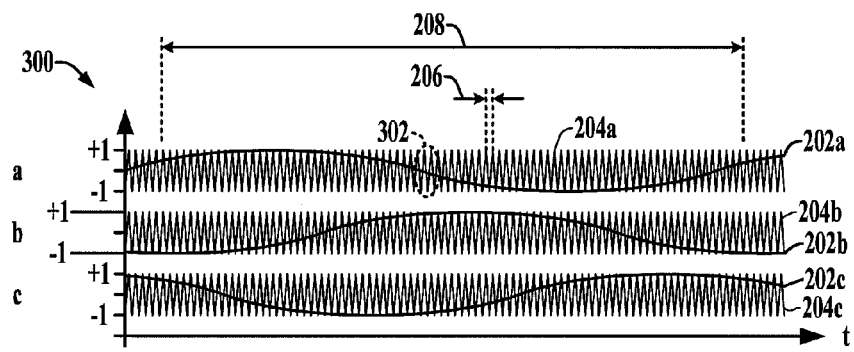
Figure 4:
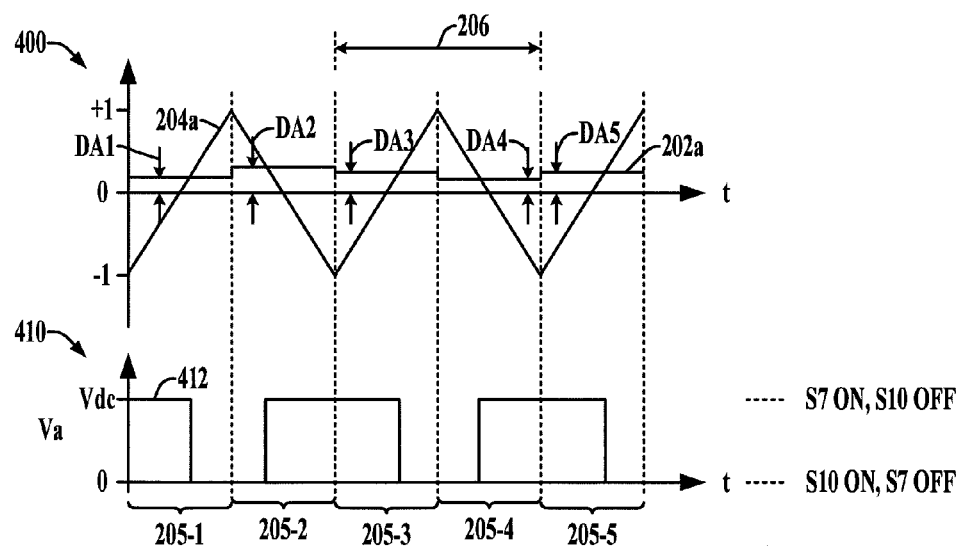

Referring also to FIGS. 2-4, a graph 200 in FIG. 2 shows a set of three generally sinusoidal modulating waveforms 202a, 202b and 202c representing duty cycles produced by the control loop 124c of the inverter switching controller 124 at a 120° phase relationship to one another, along with corresponding triangular (e.g., ramped) carrier waveforms 204a, 204b and 204c of inverter output phases a, b and c, respectively, for rotating the motor load 106 of FIG. 1. In one possible implementation, the control loop 124c implements a voltage-frequency (V-F) control scheme based on a motor speed (e.g., motor frequency) setpoint (not shown). Each of the waveforms 202 and 204 are illustrated in a per-unit (PU) range varying from −1 through +1, although any suitable numeric ranges can be used for the modulating and carrier waveforms. In the illustrated example, the control loop 124c generates a modulating waveform 202 for each output phase as a duty ratio DA, DB and DC for the corresponding inverter output phases a, b and c representing the on-time or percentage of a PWM switching cycle or period 206 for which the corresponding phase line a, b or c is connected to the positive or negative terminal of the intermediate DC circuit 116. The carrier waveforms 202 are compared with the corresponding modulating waveform 204 to generate the switching control signals 124a to operate the inverter switches S7-S12. As seen in FIG. 2, moreover, the duty ratio waveforms 202 are provided at a frequency representing the desired AC output frequency provided by the inverter waveforms having a reciprocal period 208 which is much longer than the PWM switching cycle 206.

Referring also to FIGS. 3 and 4, FIG. 3 provides a graph 300 showing another example situation at a much lower output operating frequency, in which the inverter output period 208 is much longer than that shown in FIG. 2.

FIG. 4 provides a graph 400 illustrating further details of a portion 302 of the modulating and carrier waveforms 202a and 204a for several PWM half cycles 205-1, 205-2, 205-3, 205-4 and 205-5 for which the control loop 124c determines phase a duty ratios DA1, DA2, DA3, DA4 and DA5, respectively. The graph 410 illustrates the corresponding phase voltage waveform 412 which is high when the duty ratio signal or value DA1 is greater than the carrier signal or value 204a (the output phase a has a value of Vdc when the upper phase a switch S7 is turned on and S10 is off) and the waveform 412 is low when the carrier 402a exceeds the duty ratio DA1 (output value of 0 V when the lower switch S10 is turned on and S7 is off). The inverter controller 124 in certain embodiments may determine the duty ratios DA, DA and DC as digital values via processor-executed program instructions stored in the memory 132, or such may be determined by other analog and/or digital circuitry, for example, by comparing one or more set point signals or values with one or more feedback signals and/or values. In certain embodiments, moreover, the carriers 204 may be digital values generated and compared by the processor 130 with the modulating duty ratios 202 (DA, DA and DC). In other example embodiments, the carriers 204 are generated by ramp generator circuitry (not shown).

Figure 5:
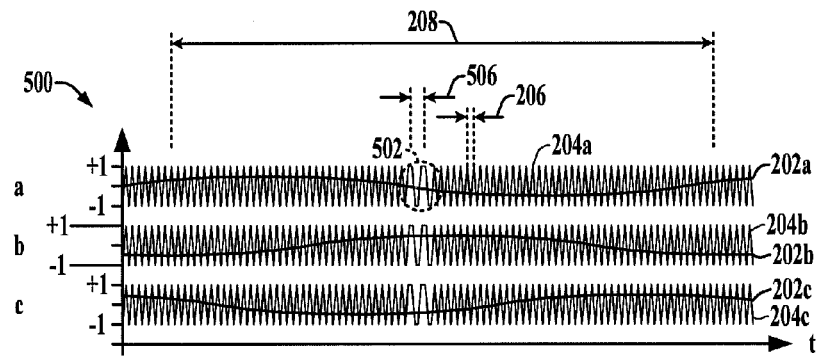
Figure 6:
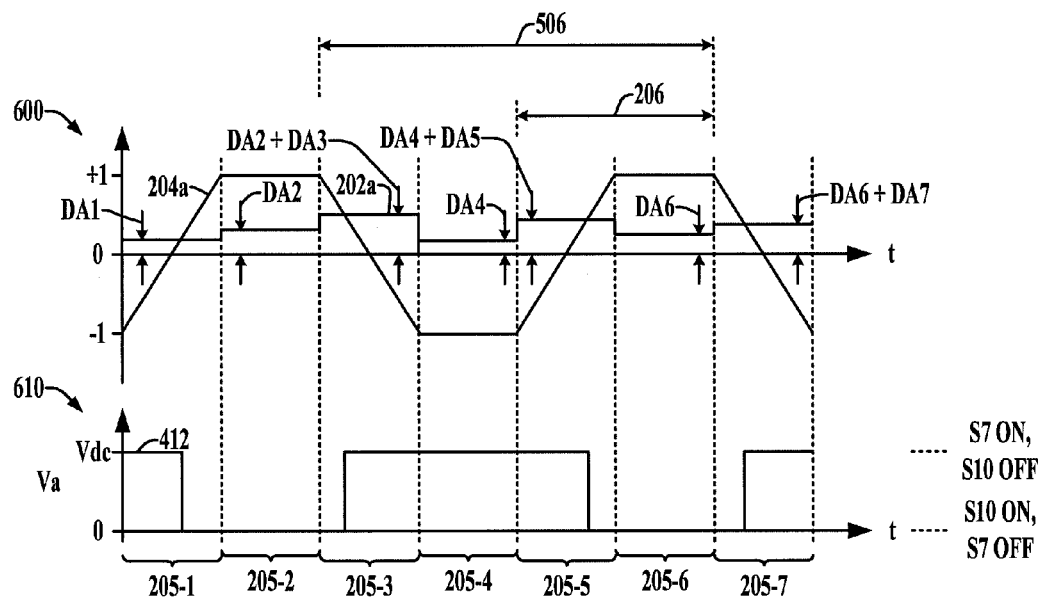

Referring also to FIGS. 5 and 6, as the duty ratio DA approaches zero, such as for low motor speeds, the time during which the upper switch S7 is on when waveform 412 in graph 410 is high decreases, and may reach pulse width levels on the order of the thermal impedance time constant of the inverter switches S7-S12. Moreover, the decreasing width of the switching control signal pulses makes it more difficult to accurately estimate the inverter output voltages based on DC bus levels and inverter switching signals. Accordingly, the controller 120 selectively suspends PWM carrier signals 204 to provide inverter switching control signals 124a using zero vectors (e.g., 111, −1−1−1) when a maximal pulse width value TPULSE is greater than a threshold value TH for a present PWM half cycle 205 and accumulates a present output value for use in a subsequent half cycle 205. FIG. 5 illustrates low-speed operation with the controller 120 providing for selective carrier suspension and duty ratio accumulation to provide an effective lower switching frequency having a longer switching cycle length 506 than the default switching cycle length 206. FIG. 6 illustrates graphs 600 and 610 showing carrier, duty ratio and switching control signal waveforms in a portion 502 of FIG. 5 using the selective carrier waveform suspension and duty ratio accumulation concepts implemented in the controller 120.

In this manner, the controller 120 selectively provides an effective reduction in the switching frequency for low-speed operation while maintaining high frequency control loop sampling in each half cycle 205. Moreover, this effective switching frequency reduction, particularly at low inverter output frequencies (e.g., low motor speeds), facilitates estimation of the inverter output phase voltages by measuring the DC bus voltage during the switching pulses in the presence of IGBT rise and fall time variations, dead time parameters, DC bus voltage sensing circuit inaccuracies and Vce voltage drops of the IGBT switches S7-S12. In addition, this concept advantageously mitigates junction temperature stress on the switches S7-S12 as the effective switching rate of the inverter switches is reduced. The inventors have further appreciated that accumulating the computed output control values during half cycles 205 in which the carrier signals 204 are suspended provides the same output voltage as would otherwise be achieved by effectively lengthening the switching pulses commensurate with the duty cycle values provided by the controller 124c.

Thus, effective control of the inverter output signal waveforms is maintained, along with the high frequency control loop operation including sampling at each half cycle 205 to maintain high control loop bandwidth. In this regard, the control concepts of the present disclosure provide a significant advance over merely reducing the PWM switching frequency for low motor speeds, whereby improved control bandwidth is maintained and the system 110 can be used in conjunction with other components (e.g., output trap filters, not shown) designed for specific switching frequencies. Furthermore, the output current and thus torque capabilities of the drive 110 are enhanced at low speed or startup conditions, wherein the employment of the selective carrier suspension with zero vector switching and duty ratio accumulation facilitates reduction in the amount of low-speed derating that would otherwise be required without requiring oversizing of the switches S7-S12, and without requiring adjustment to the nominal inverter pulse width modulation switching frequency. This, in turn, improves the performance of the power conversion system 110 without any restrictions as to the usage of an output transformer and/or trap filter circuit for motor drive and other power conversion applications.

Figure 9:
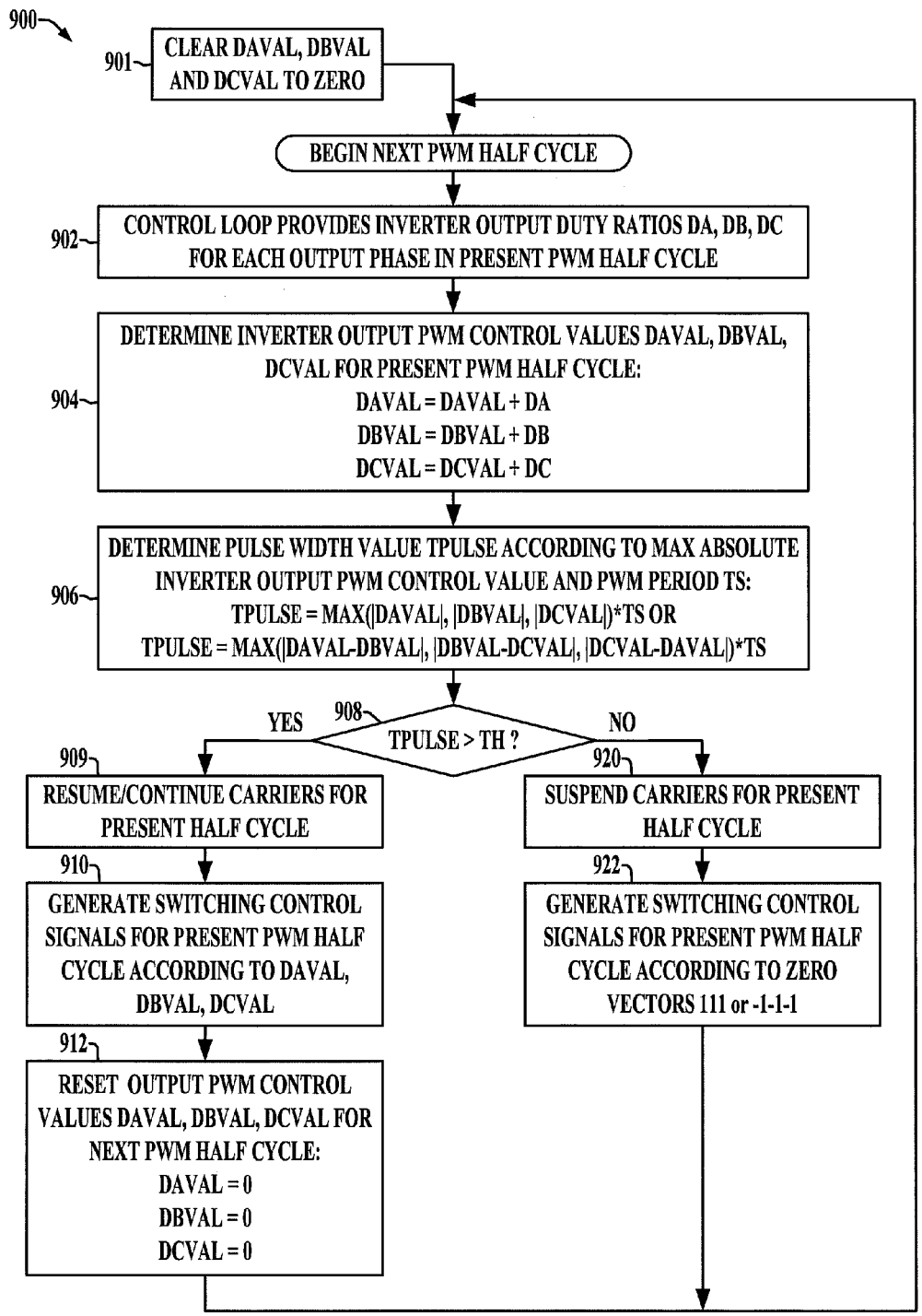
FIG. 9 is a flow diagram.

Referring also to FIG. 9, the controller 120 and the inverter switching control component 124 thereof are operative in certain embodiments according to a process 900 shown in FIG. 9. While the method 900 is illustrated and described below in the form of a series of acts or events, it will be appreciated that the various methods of the disclosure are not limited by the illustrated ordering of such acts or events. In this regard, except as specifically provided hereinafter, some acts or events may occur in different order and/or concurrently with other acts or events apart from those illustrated and described herein in accordance with the disclosure. It is further noted that not all illustrated steps may be required to implement a process or method in accordance with the present disclosure, and one or more such acts may be combined. The illustrated method 900 and other methods of the disclosure may be implemented in hardware, processor-executed software, or combinations thereof, such as in the exemplary motor drive controller 120 described above in one embodiment, and may be embodied in the form of computer executable instructions stored in a tangible, non-transitory computer readable medium, such as in a memory 132 and executed by the processor 130 in one example.

When the inverter 118 begins operation, a set of values DAVAL, DBVAL and DCVAL are cleared to zero at 901 in FIG. 9 prior to iterative processing in each of a series of PWM cycles. A new or next PWM half cycle (e.g., half cycle 205 as seen in FIGS. 4 and 9) begins at 902, with the controller (124c) computing and providing inverter output duty ratios DA, DB and DC ranging between −1 and +1 for each output phase of the present half cycle 205. As seen in FIG. 6, for instance, the controller 120 samples any feedback signals or values as well as any desired (e.g., setpoint) signals or values at the peaks and valleys of the carrier waveform 204a for each half cycle 205-1, 205-2 . . . 205-7. Using any appropriate closed loop and/or open loop control scheme, the control loop 124c provides duty ratios as signals or values for each of the inverter output phases at the beginning of each half cycle 205.

The graph 600 and FIG. 6 illustrates corresponding duty ratio values for phase "a" including DA1, DA2 . . . DA7 respectively corresponding to the PWM half cycles 205-1, 205-2 . . . 205-7. As seen in FIG. 5, for instance, the duty ratio values over a number of PWM cycles 206 provide for a generally sinusoidal set of three-phase waveforms 202a, 202b and 202c, each having a period 208 corresponding to (i.e., the reciprocal of) the desired inverter output frequency, with the waveforms 202 being offset by 120° from one another.

At 904 in FIG. 9, the controller 120 determines a present output control value DAVAL, DBVAL and DCVAL for each of the inverter output phases "a", "b" and "c" for the present PWM half cycle 205. As seen in FIG. 9, the output control values DAVAL, DBVAL and DCVAL are computed as the sum of the previous output control value DAVAL, DBVAL and DCVAL for that phase for a previous PWM half cycle 205 and the corresponding duty ratio DA, DB and DC for the present PWM half cycle 205 according to the following equations (1)-(3):

$$DAVAL=DAVAL+DA, \quad (1)$$

$$DBVAL=DBVAL+DB, \text{ and} \quad (2)$$

$$DCVAL=DCVAL+DC. \quad (3)$$

This operation selectively accumulates computed duty ratio values from previous cycles as needed for each individual inverter output phase as explained further below with respect to 912 in FIG. 9

At 906 in FIG. 9, the controller 120 determines a pulse width value TPULSE according to a maximal absolute value of the inverter output PWM control values DAVAL, DBVAL and DCVAL, and also according to the PWM period 206 (TS) according to the following equation (4a):

$$TPULSE=MAX(|DAVAL|,|DBVAL|,|DCVAL|)*TS, \quad (4a)$$

where the scaling by TS provides a temporal value indicating the effective pulse width (e.g., in microseconds) associated with the phase having the largest absolute output control value in the present PWM half cycle. In another possible embodiment, the pulse width value TPULSE is computed according to the following equation (4b):

$$TPULSE=MAX(|DAVAL-DBVAL|,|DBVAL-DCVAL|,|DCVAL-DAVAL|)*TS. \quad (4b)$$

At 908 in FIG. 9, the pulse width value TPULSE is compared with a threshold TH. If the pulse width value TPULSE exceeds the threshold (YES at 908), the process 900 proceeds to 909 where the controller 120 optionally resumes or continues the ramping of the carriers 204a, 204b and 204c for the present PWM half cycle 205, and then generates the switching control signals 124a (FIG. 1 above) for the present PWM half cycle 205 at 910 in FIG. 9 according to the inverter output PWM control values DAVAL, DBVAL and DCVAL. At 912 in FIG. 9, the controller 120 resets each of the output PWM control values DAVAL, DBVAL and DCVAL to zero before proceeding to begin the next PWM half cycle as described above.

If the pulse width value TPULSE does not exceed the threshold (NO at 908), the controller suspends (e.g., freezes) the carrier signals for the present half cycle at 920 and generates the switching control signals at 922 for the present PWM half cycle 205 according to zero vectors for each of the inverter output phases (e.g., 111, −1−1−1). This operation is illustrated in FIG. 6 where the successive duty ratio values for phase "a" including DA1 and DA2 are shown in the respective half cycles 205-1 and 205-2. In this situation, the controller 120 determines (e.g., at 908 in FIG. 9) that the computed pulse width value TPULSE does not exceed the threshold TH, and accordingly suspends the carrier 204*a* during the half cycle 205-2 as seen in the graph 600 of FIG. 6. In this regard, the carrier is suspended at its maximal value +1 for the half cycle 205-2, and the controller 120 accumulates the corresponding duty cycle value DA2 in the computation of the corresponding inverter output PWM control value DAVAL.

Upon computing the control values at 904 for the succeeding PWM half cycle 205-3, the controller 120 computes the new value DAVAL as the sum of DA2+DA3. In this example, moreover, the controller determines at 906 and 908 that the maximal absolute PWM control value scaled by the PWM period TS (MAX(|DAVAL|, |DBVAL|, |DCVAL|)*TS) exceeds the threshold TH, and thus resumes the downward ramping of the carrier waveform 204*a* during the half cycle 205-3. This, in turn, causes a rising edge in the waveform 412 for the output voltage Va corresponding to phase "a" at the output of the inverter 118 with switch S7 being turned on and switch S10 being turned off when the computed control value (DA2+DA3) exceeds the downward ramping carrier signal 204*a* during the half cycle 205-3. During this half cycle 205-3, moreover, the output PWM control values DAVAL, DBVAL and DCVAL are again reset to zero at 912 in FIG. 9.

In the example of FIG. 6, the duty ratio accumulation and carrier suspension situation is again repeated with the controller 120 selectively suspending the ramping of the carrier signal 204*a* in response to the pulse width value TPULSE being less than or equal to the threshold value TH during the PWM half cycle 205-4. Since the carrier waveform 204*a* at this point is suspended at the minimal value −1, the pulse in the waveform 412 continues high with S7 remaining on and S10 remaining off during the half cycle 205-4. In this example, moreover, the computed pulse width value TPULSE again exceeds the threshold TH in the subsequent half cycle 205-5, and the controller 120 accordingly resumes the ramping (upward) of the carrier signal 204*a*, causing the waveform 412 to return to zero (S10 on, S7 off) when the carrier waveform 204*a* exceeds the computed (e.g., accumulated) control value (DA4+DA5).

In the next half cycle 205-6, the controller 120 again determines that the computed pulse width value TPULSE does not exceed the threshold TH, and accordingly suspends the carrier waveform 204*a* at the +1 value. Thereafter in the half cycle 205-7, the controller 120 resumes the downward ramping of the carrier waveform 204*a* and compares the accumulated value DA6+DA7 with the carrier 204*a*, causing the waveform 412 to go high as shown in FIG. 6 when the accumulated output PWM control value DAVAL exceeds the carrier 204*a*. While FIG. 6 illustrates only a single phase (phase "a") of the inverter 118, similar operation is performed in controlling the switching control signals 124*a* provided to the other phases "b" and "c" of the inverter 118, as shown in the graph 500 of FIG. 5.

As seen in FIGS. 5 and 6, the selective operation in the highlighted portion 502 provides an effective PWM switching cycle period 506 which is twice as long as the nominal PWM switching cycle 206, thereby providing an effective PWM switching frequency that is half of the nominal value. Importantly, moreover, the controller 120 continues throughout the illustrated portion 502 to update the control loop 124*c* at twice the nominal PWM switching frequency. Accordingly, the control bandwidth is maintained while selectively lowering the effective PWM switching frequency. At low motor speeds, therefore, the controller 120 advantageously mitigates thermal stress to the switches S7-S12. In addition, as seen in the graph 610 of FIG. 6, the effective pulse widths provided via the switching control signals 124*a* (e.g., curve 412 in FIG. 6) are of sufficient duration to mitigate excessive switching losses in the switches S7-S12 while also facilitating accurate assessment of the inverter output voltages by measuring the DC bus voltage during the switching pulses.

The threshold value TH in certain embodiments may be adjustable, and may be set according to a variety of desired operating conditions. In particular, the threshold TH may be set such that low-speed (e.g., or startup) derating of the power conversion system 110 is not needed, or the need for such derating is reduced. In one possible embodiment, the threshold value TH is greater than a rise time variation of the switches S7-S12 in order to facilitate inverter output voltage estimation without requiring direct sensors at the output of the inverter 118

Figure 7:
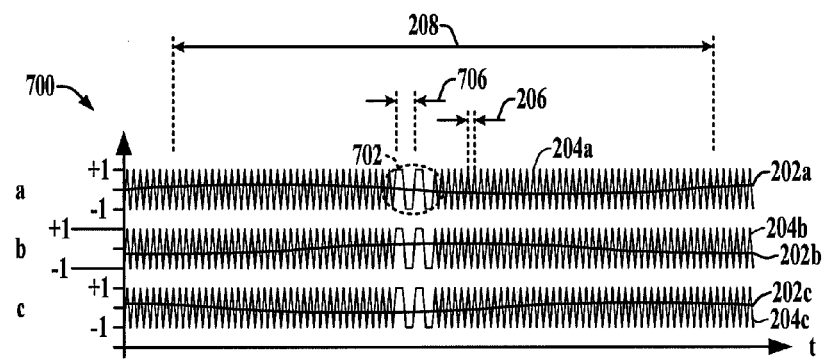
Figure 8:
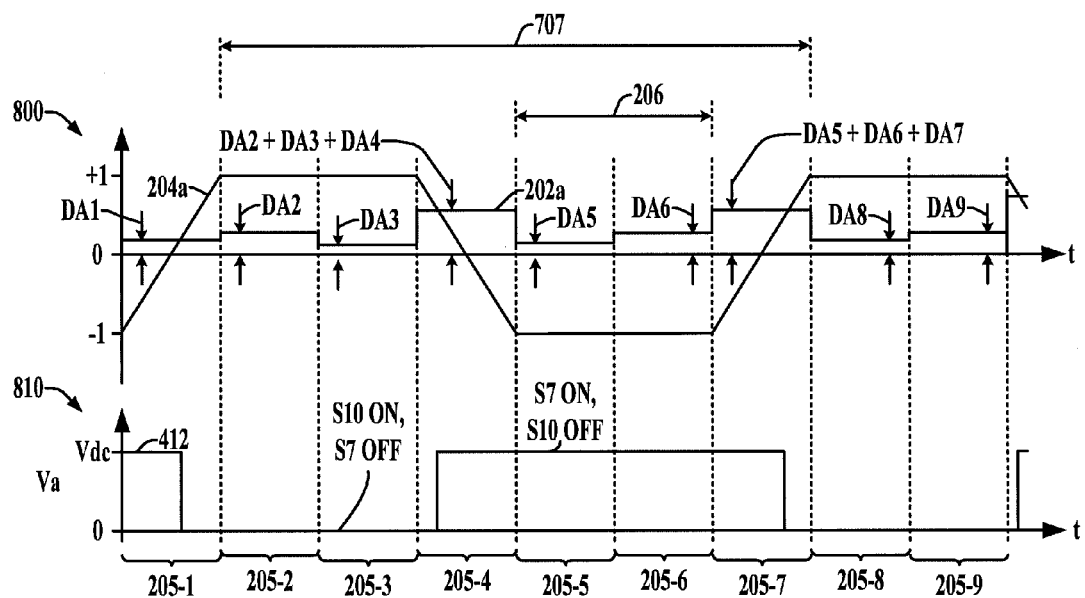

Referring now to FIGS. 7 and 8, the selective suspension or "freezing" of the carrier waveforms 204 and the corresponding accumulation of the provided duty ratio values 202 in the controller 120 can provide an effective doubling of the PWM switching cycle period as seen above, or further reduction in the switching frequency may occur based on the computed duty ratio values DA, DB and DC and the corresponding threshold value TH. In particular, the above described control techniques and apparatus provide for selective operation at a nominal switching frequency FS/2, FS/3, FS/4, . . . , FS/N, where N is a positive integer.

FIGS. 7 and 8 illustrates graphs 700, 800 and 810 shown waveforms in the system 110 in a different situation in which the computed duty ratios DA, DB and DC are lower and/or the threshold TH is set higher. In this case, FIG. 8 illustrates a portion 702 of FIG. 7 in which the controller 120 selectively accumulates duty ratio values DA2 and DA3 in consecutive PWM half cycles 205-2 and 205-3 while maintaining or suspending the carrier waveform 204*a* at the maximal value +1. Once the computed pulse width value TPULSE exceeds the threshold TH (YES at 908 in FIG. 9) during the next PWM half cycle 205-4, the controller 120 resumes the downward ramping of the carrier waveform 204*a*, causing the switching waveform 412 to go high when the accumulated duty ratio summation DA2+DA3+DA4 exceeds the carrier waveform 204*a*. Following the half cycle 205-4, moreover, the controller 120 again suspends the carrier waveform 204*a* (this time at the minimal value −1) and accumulates the computed duty ratio values DA5 and DA6 during the next two PWM half cycles 205-5 and 205-6 as shown in FIG. 8.

In the next half cycle 205-7, the controller 120 resumes the upward ramping of the carrier waveform 204*a* whose value is compared with the summation of DA5+DA6+DA7 during the half cycle 205-7, causing a downward edge in the waveform 412 in the graph 810 of FIG. 8. The controller 120 again suspends the carrier waveform (at the maximal value +1) during the subsequent PWM half cycles 205-8 and 205-9) while accumulating the corresponding computed duty ratio values DA8 and DA9, and the operation in this fashion may continue for some time or be discontinued once the computed duty ratios are such that the computed pulse width TPULSE regularly exceeds the threshold value TH. As seen in FIGS. 7 and 8, moreover, this example shows effective reduction of the switching frequency by one third, with the effective switching cycle period 707 being three times as long as the nominal PWM switching cycle period 206.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising". This description uses examples to disclose various embodiments and also to enable any person skilled in the art to practice the disclosed subject matter, including making and using any devices or systems and performing any incorporated methods. It will be evident that various modifications and changes may be made, and additional embodiments may be implemented, without departing from the broader scope of the present disclosure as set forth in the following claims, wherein the specification and drawings are to be regarded in an illustrative rather than restrictive sense.

The following is claimed:

1. A method for controlling a switching inverter, the method comprising:
   determining a duty ratio for each output phase of the switching inverter for a present pulse width modulation (PWM) half cycle;
   determining, for each output phase, a present output control value for the present PWM half cycle as a sum of a previous output control value corresponding to a previous PWM half cycle and the duty ratio corresponding to the present PWM half cycle;
   determining a pulse width value for the present PWM half cycle according to a maximal one of the present output control values or a maximal present output control value difference between two phases for the present PWM half cycle;
   selectively generating switching control signals to operate the switching inverter for the present PWM half cycle according to the present output control values in response to the pulse width value for the present PWM half cycle being greater than a threshold value;
   selectively resetting the present output control values to zero in response to the pulse width value for the present PWM half cycle being greater than the threshold value; and
   selectively generating the switching control signals to operate the switching inverter for the present PWM half cycle according to a zero vector in response to the pulse width value for the present PWM half cycle being less than or equal to the threshold value.

2. The method of claim 1, wherein determining the pulse width value for the present PWM half cycle comprises;
   determining the maximal one of the present output control values or the maximal present output control value difference between two phases for the present PWM half cycle; and
   multiplying the maximal one of the present output control values or the maximal present output control value difference between two phases for the present PWM half cycle by a PWM cycle value corresponding to a full PWM cycle.

3. The method of claim 1, comprising:
   selectively suspending ramping of carriers for each output phase for the present PWM half cycle in response to the pulse width value for the present PWM half cycle being less than or equal to the threshold value.

4. The method of claim 3, comprising:
   selectively resuming the ramping of the carriers for each output phase for the present PWM half cycle for generating the switching control signals in response to the pulse width value for the present PWM half cycle being greater than a threshold value.

5. The method of claim 1, wherein the threshold value is greater than a rise time variation of switches of the switching inverter.

6. The method of claim 1, wherein the duty ratio for each output phase is determined for the present PWM half cycle according to a voltage-frequency control loop.

7. The method of claim 1, wherein the duty ratio for each output phase is determined for the present PWM half cycle at a peak or valley of carriers for each output phase for the present PWM half cycle.

8. The method of claim 7, comprising:
   selectively suspending ramping of the carriers for each output phase for the present PWM half cycle in response to the pulse width value for the present PWM half cycle being less than or equal to the threshold value; and
   selectively resuming the ramping of the carriers for each output phase for the present PWM half cycle for generating the switching control signals in response to the pulse width value for the present PWM half cycle being greater than a threshold value.

9. A non-transitory computer readable medium with computer executable instructions for controlling a switching inverter, the computer readable medium comprising computer executable instructions for:
   determining a duty ratio for each output phase of the switching inverter for a present pulse width modulation (PWM) half cycle;
   determining, for each output phase, a present output control value for the present PWM half cycle as a sum of a previous output control value corresponding to a previous PWM half cycle and the duty ratio corresponding to the present PWM half cycle;
   determining a pulse width value for the present PWM half cycle according to a maximal one of the present output control values or a maximal present output control value difference between two phases for the present PWM half cycle;
   selectively generating switching control signals to operate the switching inverter for the present PWM half cycle according to the present output control values in response to the pulse width value for the present PWM half cycle being greater than a threshold value;
   selectively resetting the present output control values to zero in response to the pulse width value for the present PWM half cycle being greater than the threshold value; and
selectively generating the switching control signals to operate the switching inverter for the present PWM half cycle according to a zero vector in response to the pulse width value for the present PWM half cycle being less than or equal to the threshold value.

10. An apparatus for controlling a multiphase inverter, comprising:

an electronic memory; and at least one processor programmed to:
- determine a duty ratio for each output phase of the multiphase inverter for a pulse width modulation (PWM) half cycle;
- determine, for each output phase, a present output control value for the present PWM half cycle as a sum of a previous output control value corresponding to a previous PWM half cycle and the duty ratio corresponding to the present PWM half cycle;
- determine a pulse width value for the present PWM half cycle according to a maximal one of the present output control values or a maximal present output control value difference between two phases for the present PWM half cycle;
- selectively generate switching control signals to operate the switching inverter for the present PWM half cycle according to the present output control values in response to the pulse width value for the present PWM half cycle being greater than a threshold value;
- selectively reset the present output control values to zero in response to the pulse width value for the present PWM half cycle being greater than the threshold value; and
- selectively generate the switching control signals to operate the switching inverter for the present PWM half cycle according to a zero vector in response to the pulse width value for the present PWM half cycle being less than or equal to the threshold value.

11. The apparatus of claim 10, wherein the at least one processor is programmed to implement a voltage-frequency control loop relating a setpoint inverter output frequency to phase output voltages of the switching inverter to determine the duty ratio for each output phase of the switching inverter for the present PWM half cycle.

12. The apparatus of claim 10, wherein the at least one processor is programmed to determine the duty ratio for each output phase for the present PWM half cycle at a peak or valley of carriers for each output phase for the present PWM half cycle.

13. The apparatus of claim 12, wherein the at least one processor is programmed to:
- selectively suspend ramping of the carriers for each output phase for the present PWM half cycle in response to the pulse width value for the present PWM half cycle being less than or equal to the threshold value; and
- selectively resume the ramping of the carriers for each output phase for the present PWM half cycle to generate the switching control signals in response to the pulse width value for the present PWM half cycle being greater than a threshold value.

14. The apparatus of claim 13, wherein the threshold value is greater than a rise time variation of switches of the switching inverter.

15. The apparatus of claim 14, wherein the at least one processor is programmed to determine the pulse width value for the present PWM half cycle by;
- determining the maximal one of the present output control values or the maximal present output control value difference between two phases for the present PWM half cycle; and
- multiplying the maximal one of the present output control values or the maximal present output control value difference between two phases for the present PWM half cycle by a PWM cycle value corresponding to a full PWM cycle.

16. The apparatus of claim 13, wherein the at least one processor is programmed to determine the pulse width value for the present PWM half cycle by;
- determining the maximal one of the present output control values or the maximal present output control value difference between two phases for the present PWM half cycle; and
- multiplying the maximal one of the present output control values or the maximal present output control value difference between two phases for the present PWM half cycle by a PWM cycle value corresponding to a full PWM cycle.

17. The apparatus of claim 12, wherein the at least one processor is programmed to determine the pulse width value for the present PWM half cycle by;
- determining the maximal one of the present output control values or the maximal present output control value difference between two phases for the present PWM half cycle; and
- multiplying the maximal one of the present output control values or the maximal present output control value difference between two phases for the present PWM half cycle by a PWM cycle value corresponding to a full PWM cycle.

18. The apparatus of claim 10, wherein the threshold value is greater than a rise time variation of switches of the switching inverter.

19. The apparatus of claim 18, wherein the at least one processor is programmed to determine the pulse width value for the present PWM half cycle by;
- determining the maximal one of the present output control values or the maximal present output control value difference between two phases for the present PWM half cycle; and
- multiplying the maximal one of the present output control values or the maximal present output control value difference between two phases for the present PWM half cycle by a PWM cycle value corresponding to a full PWM cycle.

20. The apparatus of claim 10, wherein the at least one processor is programmed to determine the pulse width value for the present PWM half cycle by;
- determining the maximal one of the present output control values or the maximal present output control value difference between two phases for the present PWM half cycle; and
- multiplying the maximal one of the present output control values or the maximal present output control value difference between two phases for the present PWM half cycle by a PWM cycle value corresponding to a full PWM cycle.

* * * * *